United States Patent [19]

Campbell, Jr.

[11] Patent Number: 4,484,092
[45] Date of Patent: Nov. 20, 1984

[54] MOS DRIVER CIRCUIT HAVING CAPACITIVE VOLTAGE BOOSTING

[75] Inventor: Jules D. Campbell, Jr., Austin, Tex.

[73] Assignee: Motorola, Inc., Schaumburg, Ill.

[21] Appl. No.: 360,123

[22] Filed: Mar. 22, 1982

[51] Int. Cl.³ .................. H03K 17/06; H03K 17/284; H03K 17/687

[52] U.S. Cl. .................. 307/578; 307/246; 307/270; 307/568; 307/597; 307/482

[58] Field of Search ............ 307/264, 270, 482, 578, 307/450, 246, 565, 568, 597

[56] References Cited

U.S. PATENT DOCUMENTS

| | | | |
|---|---|---|---|
| 3,631,267 | 12/1971 | Heimbigner | 307/482 X |
| 3,714,466 | 1/1973 | Spence | 307/270 X |
| 3,769,528 | 10/1973 | Chu et al. | 307/578 X |
| 3,778,784 | 12/1973 | Karp et al. | 307/270 X |
| 3,937,983 | 2/1976 | Reed | 307/270 X |
| 4,049,979 | 9/1977 | Shieu et al. | 307/482 X |
| 4,063,117 | 12/1977 | Laugesen et al. | 307/482 X |
| 4,122,361 | 10/1978 | Clemen et al. | 307/482 X |

Primary Examiner—Larry N. Anagnos
Attorney, Agent, or Firm—Anthony J. Sarli, Jr.; Jeffrey Van Myers; Robert L. King

[57] ABSTRACT

An MOS driver circuit having a capacitive voltage booster is provided. A first capacitor which is charged to a supply voltage potential is used to control a precharge device which charges a second capacitor. The charge on the second capacitor is sequentially translated by a logic portion to provide a boosted driver voltage which is substantially greater than the supply voltage to an active driver circuit. The output driver circuit may be completely disabled to eliminate a standby current in the output.

10 Claims, 4 Drawing Figures

MOS DRIVER CIRCUIT HAVING CAPACITIVE VOLTAGE BOOSTING

TECHNICAL FIELD

This invention relates generally to driver circuits and, more particularly, to an MOS driver circuit utilizing a capacitive voltage booster which time sequentially provides a boosted control voltage.

BACKGROUND ART

Generally, driver circuits which utilize a voltage booster circuit have used a bootstrap circuit. In MOS technology, one of several implementations of a bootstrap circuit embodies the use of enhancement type transistors and a depletion type MOS capacitor. Typically, a transistor is used as a switching device and another transistor is used as a load device which is coupled to an output terminal. Although the bootstrap circuit can provide an output driver voltage which is greater than the supply voltage, the load device is always conductive when the switching transistor is conductive and creates a standby or static current. To avoid an undesirable output voltage for low logic levels, the size of the load and switching devices must be maintained at specific ratios to one another. Further, since a capacitor is generally connected to an output, the driver circuit has a slow output rise time when capacitively loaded. A modification of the bootstrap circuit is a mirrored bootstrap circuit which may be used to improve the output rise time. However, a standby current also exists in such mirrored bootstraps. Also, most bootstrap circuits are limited in that the capacitive boosting voltage is only some fraction of the supply voltage. Charge on a capacitor in bootstrap circuits can also be lost by discharge through a precharge device and by parasitic capacitances coupled to ground potential. As a practical result, the output driver voltage can never attain twice the value of the supply voltage. Further disadvantages include the fact that in order to drive high capacitance loads, bootstrap circuits must use large enhancement type load transistors which increase the power consumed by the circuit. Large device sizes also slow the performance of the driver and impact die size and yield.

SUMMARY OF THE INVENTION

Accordingly, an object of the present invention is to provide an improved MOS driver circuit utilizing a capacitive boost circuit.

Another object of the invention is to provide an improved MOS driver circuit having time sequential capacitive boosting of transistor gate control voltages.

Yet another object of the invention is to provide an improved MOS driver having high speed characteristics and using less power than driver circuits of the prior art.

In carrying out the above and other objects of the present invention, there is provided, in one form, an MOS driver circuit comprising active load and switching devices which are coupled between two supply voltages and to an output. The driver devices are controlled by a boosted driver voltage which is substantially above the level of one of the supply voltages and which is provided by a capacitive voltage booster circuit. The capacitive voltage booster circuit comprises two capacitors which are time sequentially precharged by first and second precharge devices, respectively, and also discharged. The first capacitor boosts the control voltage of the second precharge device which is used to charge the second capacitor. The second capacitor boosts the driver voltage thereby reducing both the size of the driver devices and the power dissipation and increasing the speed of the MOS driver. A clamping device restricts the range of the control voltage of the second precharge device to prevent partial discharge of the second capacitor while the second capacitor is providing the boosted driver voltage. Control means are utilized to sequentially vary the charge on the second capacitor in response to the level of an input voltage signal.

The above and other objects, features and advantages of the present invention will be more clearly understood from the following detailed description taken in conjunction with the accompanying drawings.

DESCRIPTION OF THE PREFERRED EMBODIMENT

Figure 1:
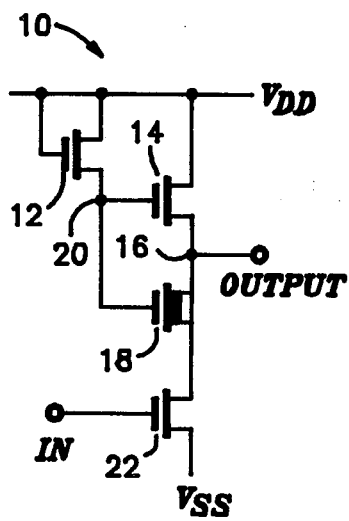
FIG. 1 illustrates in schematic form a driver circuit utilizing a bootstrap technique known in the prior art.

Shown in FIG. 1 is an MOS embodiment of a common bootstrap circuit 10 which provides an output voltage in response to an input voltage changing from a high logic level to a low logic level. While specific N-channel MOS devices are shown for all circuits which are discussed, it should be clear that all the circuits could be implemented by completely reversing the processing techniques (E.G. N-channel to P-channel) or by using other types of transistors. A transistor 12 has the gate and drain thereof connected to a supply voltage, say $V_{DD}$. A driver transistor 14 has a drain connected to supply voltage $V_{DD}$, a gate connected to a source of transistor 12, and a source connected to an output at a node 16. A capacitor 18 which is fabricated in a conventional manner from a transistor structure has the source and drain thereof connected together to form a first electrode or plate, and has a gate which forms a second electrode or plate. The first plate of capacitor 18 is connected to the source of transistor 14 and to the output at node 16, and the second plate is connected to both the source of transistor 12 and the gate of transistor 14 at a node 20. A switching transistor 22 has a drain connected to the first plate of capacitor 18, to the source of transistor 14 and to the output, a gate connected to an input and a source connected to a ground voltage, say $V_{SS}$. In a typical embodiment, transistors 12, 14 and 22 are enhancement type transistors and capacitor 18 is made from a depletion type transistor.

In operation, switching transistor 22 couples the first plate of capacitor 18 to ground voltage $V_{SS}$ in response to a positive transition in the input signal, whereby capacitor 18 is charged by transistor 12 to $V_{DD}$ minus the gate-to-source voltage of transistor 12, $V_{GS}12$, and remains charged. When capacitor 18 is charged, transistor 14 is conductive. As a result, transistor 22 must sink all the current produced by transistor 14 in order to produce a valid logic low at node 16. Transistors 14 and 22 must, therefore, be properly ratioed with one another and transistor 22 must be significantly larger. When transistor 22 becomes nonconductive, transistor 14 causes the output voltage at node 16 to rise to nearly supply voltage $V_{DD}$. Simultaneously, the voltage across capacitor 18 does not substantially change so that the gate voltage of transistor 14 at node 20 is substantially equal to the sum of the output voltage at node 16 and the voltage across capacitor 18. However, some change in voltage across capacitor 18 results from charge redistribution associated with parasitic capacitance. For this reason, a boosted output drive voltage can only approach twice the value of the supply voltage $V_{DD}$. Unfortunately, since transistor 14 remains conductive for an output logic low, a current exists in driver transistor 14 and some voltage is thus always present at the output. Another disadvantage associated with the use of high capacitance loads on circuit 10 is that the output voltage has a slow rise time.

Figure 2:
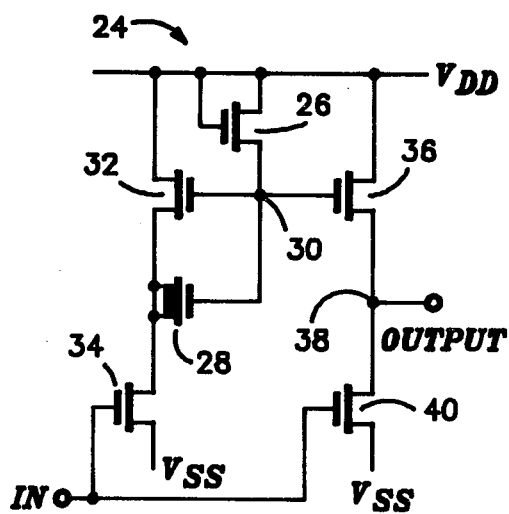
FIG. 2 illustrates in schematic form yet another driver circuit utilizing a bootstrap technique known in the prior art.

Shown in FIG. 2 is an MOS embodiment of a known mirrored bootstrap circuit 24 which provides a drive voltage and has some advantages over the circuit of FIG. 1. A transistor 26 has the drain and gate thereof connected together to a supply voltage $V_{DD}$. A capacitor 28 which is fabricated in a conventional manner from a transistor structure has a drain and a source of the transistor structure connected together to form a first electrode or plate. A second electrode or plate of capacitor 28 is a gate of the transistor structure and is connected to the source of transistor 26 at node 30. A transistor 32 has the drain thereof connected to supply voltage $V_{DD}$, the gate thereof connected to both the source of transistor 26 and the second plate of capacitor 28 at node 30, and the source thereof connected to the first plate of capacitor 28. A transistor 34 has the drain thereof connected to both the source of transistor 32 and the first plate of capacitor 28, the source thereof connected to a ground voltage $V_{SS}$, and the gate thereof connected to an input terminal. A transistor 36 has a drain connected to supply voltage $V_{DD}$, and has a gate connected to the source of transistor 26, to the gate of transistor 32 and to the second plate of capacitor 28 at node 30. A source of transistor 36 is connected to an output at node 38. A transistor 40 has the drain thereof connected to both the source of transistor 36 and the output at node 38, the source thereof connected to ground voltage $V_{SS}$, and a gate connected to both the input voltage and gate of transistor 34. In a typical embodiment, transistors 26, 32, 34, 36 and 40 are enhancement type transistors and capacitor 28 is made from a depletion type transistor.

In operation, transistors 26, 32 and 34 and capacitor 28 form the same simple bootstrap portion shown in FIG. 1. As used, the simple bootstrap circuit functions as a pusher circuit for providing a driver voltage which is coupled to the gate of transistor 36 which serves as an enhancement type load device. The slow rise time at the output of circuit 10 of FIG. 1 due to capacitive loading has been removed from circuit 24. Further, the drive voltage present at node 30 is independent of the output voltage. However, circuit 24 also has the other disadvantages which circuit 10 has. A current exists in the circuit because transistors 32 and 36 are conducting while the output is a logic low. Only when an output load is purely capacitive and charged to a logic high will transistor 36 cease conduction.

Figure 3:
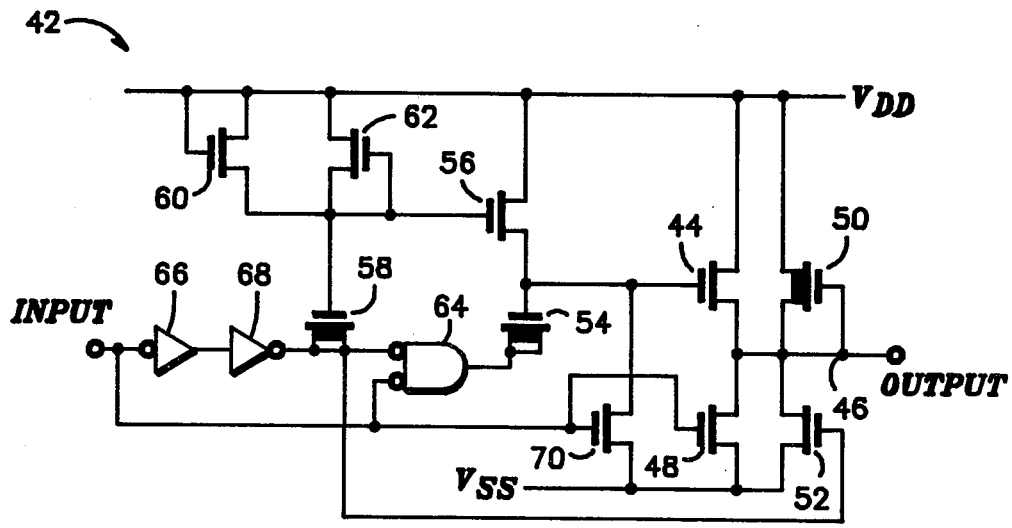
FIG. 3 illustrates in schematic form a driver circuit constructed in accordance with the preferred embodiment of the present invention.

Shown in FIG. 3 is an NMOS embodiment of driver circuit 42 which provides a driver voltage while substantially reducing the amount of current used in prior art circuits. In a preferred embodiment, an active load transistor 44 has a drain connected to a supply voltage $V_{DD}$ and a source connected to the output at a node 46. A switching transistor 48 has a drain connected to both the output at node 46 and the source of transistor 44, and a source connected to a supply voltage $V_{SS}$. In the preferred embodiment, a depletion type transistor 50 has a drain connected to supply voltage $V_{DD}$ and also has both a source and a gate or control electrode connected to the output at node 46. Although transistor 50 serves to sustain the output voltage from falling as a result of leakage current, transistor 50 is not essential to the operation of driver circuit 42. A switching transistor 52 has a drain connected to the sources of transistors 44 and 50, to the drain of transistor 48 and to the output at node 46. A source of transistor 52 is connected to supply voltage $V_{SS}$. A first capacitor 54, which is fabricated in a conventional manner from a depletion type transistor structure, has the gate thereof utilized as a first electrode or plate which is coupled to the gate of load transistor 44. A source and drain of the transistor structure of capacitor 54 are connected together to form a second electrode or plate. A first precharge transistor 56 has a drain connected to supply voltage $V_{DD}$ and a source connected to both the first plate of capacitor 54 and the gate of transistor 44. A second capacitor 58 which is also fabricated in a conventional manner from a depletion type transistor has a gate or control electrode thereof utilized as a first electrode or plate which is coupled to the gate of transistor 56. A source and drain of the transistor structure of capacitor 58 are connected together to form a second electrode or plate which is coupled to a gate of switching transistor 52. A second precharge transistor 60 has the drain and gate thereof connected to supply voltage $V_{DD}$, and the source thereof connected to both a gate of transistor 56 and the first plate of capacitor 58. A clamping transistor 62 has the source thereof connected to supply voltage $V_{DD}$. A drain and gate of transistor 62 are connected together and are also connected to the gate of transistor 56, to the source of transistor 60 and to the first plate of capacitor 58. A logic gate 64 has a first input connected to both the second plate of capacitor 58 and the gate of transistor 52, a second input connected to both an input signal and the gate of transistor 48, and an output connected to the second plate of capacitor 54. In the preferred embodiment, logic gate 64 is a controller which is implemented physically as an active high NOR gate and the logic performed is equivalent to an active low AND gate. An inverter 66 has an input coupled to the input signal, to the gate of transistor 48 and to the second input of logic gate 64. An inverter 68 has an input connected to an output of inverter 66, and an output connected to the second plate of capacitor 58, to the gate of transistor 52 and to the first input of logic gate 64. A disabling transistor 70 has a drain connected to the first plate of capacitor 54, to the source of transistor 56 and to the gate of transistor 44. A source of transistor 70 is connected to supply voltage $V_{SS}$ and the gate thereof is connected to the input, to the second input of logic gate 64, to the input of inverter 66 and to the gate of transistor 48.

Figure 4:
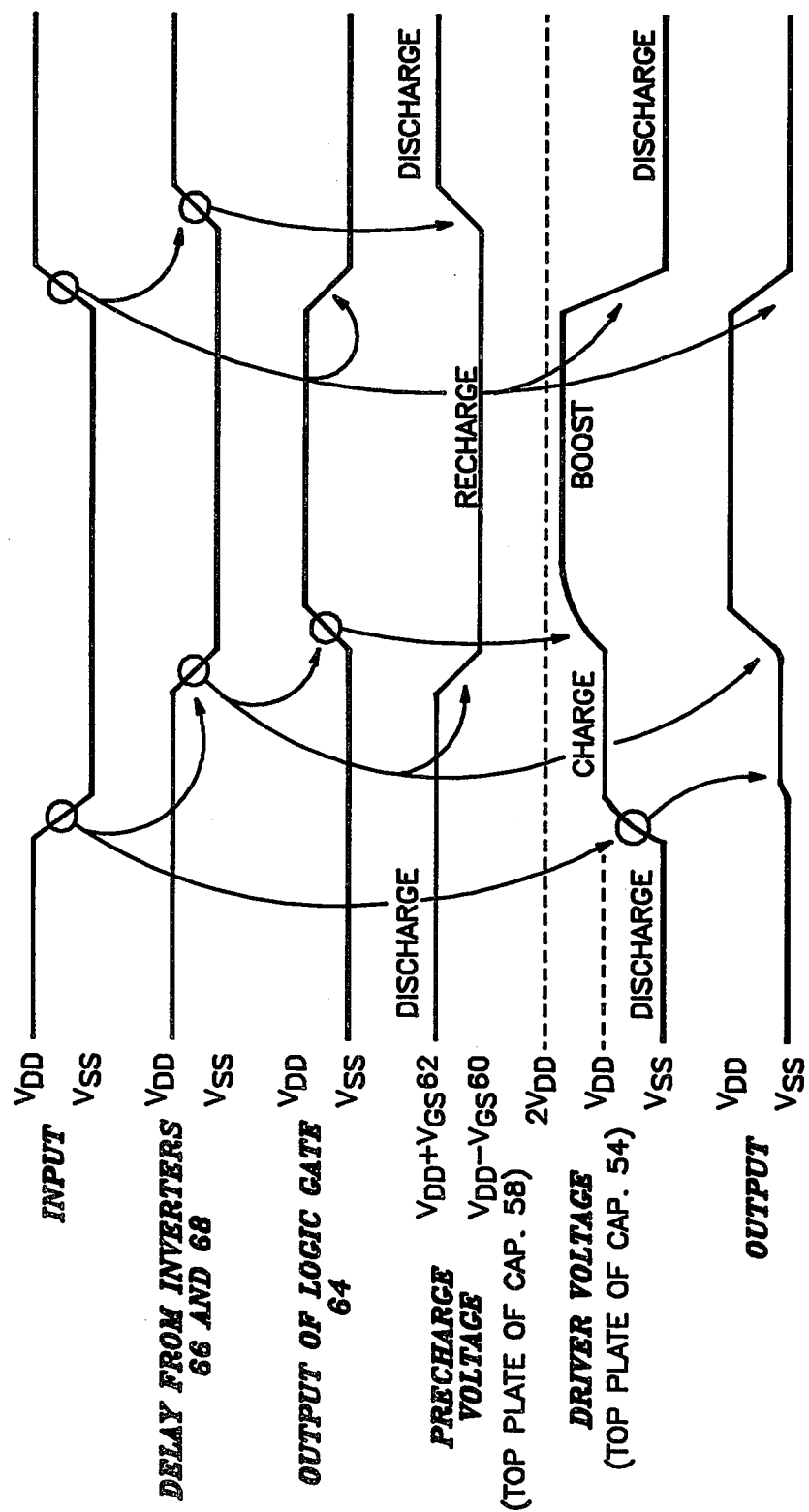
FIG. 4 illustrates in graphical form selected voltages associated with the circuit of FIG. 3.

In operation, assume that the input voltage is initially at a high logic level of $V_{DD}$, as shown in FIG. 4, before transitioning to a low level of $V_{SS}$. Since transistor 60 has precharged capacitor 58 to substantially $V_{DD}$, the gate voltage of transistor 56 is at a voltage of $V_{DD}$ plus the gate-to-source voltage of transistor 62, $V_{GS}62$. Since the inputs of logic gate 64 are both at a high logic level, the output is at a low logic level. Transistor 70 has been made conductive by the input signal so that the first or top plate of capacitor 54 is near $V_{SS}$ potential and thus capacitor 54 is discharged to $V_{SS}$ as shown in FIG. 4. As a result, transistor 44 is nonconductive and transistor 48 is made conductive by the input signal. Therefore, the output is at a low logic level and no current exists in load transistor 44.

When the input voltage changes to a low level, the second input of logic gate 64 is at a low level and transistor 70 is made nonconductive. Thus, the first or top plate of capacitor 54 charges toward $V_{DD}$ through transistor 56. As a result, the output voltage at node 46 increases slightly as shown in FIG. 4 since transistor 44 is made partially conductive. After an initial delay through inverters 66 and 68, the first input of logic gate 64 becomes low and the output of logic gate 64 rises from $V_{SS}$ to $V_{DD}$ potential.

However, before the output of logic gate 64 changes, the gate voltage of transistor 56 has dropped below $V_{DD}$ since the second plate of capacitor 58 was pulled to a low level. Because both the drain voltage and source voltage of transistor 56 exceed the gate voltage thereof, transistor 56 is made nonconductive and therefore cannot discharge capacitor 54. When the voltage on the second or bottom plate of capacitor 58 drops to $V_{SS}$ potential, the precharge voltage or voltage on the first or top plate of capacitor 58 drops to a potential of $V_{DD}$ minus the gate-to-source voltage of transistor 60, $V_{GS}60$. Capacitor 58 is then recharged by transistor 60. After the second plate of capacitor 54 is raised to a voltage potential near $V_{DD}$, the voltage on the first plate of capacitor 54 is boosted to substantially 2 $V_{DD}$. Capacitor 58 is used to increase the charge on capacitor 54 and is relatively small in value in comparison with capacitor 54.

When the input voltage changes back to a high logic level, transistors 48 and 70 are made conductive and the output at node 46 falls back to nearly $V_{SS}$ potential. Also, the first or top plate of capacitor 54 is coupled to $V_{SS}$ potential via transistor 70. The output of logic gate 64 has also fallen to a voltage which is substantially $V_{SS}$ so that capacitor 54 is effectively discharged to quickly turn off transistor 44 at the output. After an initial delay determined by the propagation time through inverters 66 and 68, a high voltage level appears on the second or bottom plate of capacitor 58. Since capacitor 58 is partially discharged by transistor 62, the voltage on the first or top plate of capacitor 58 shown in FIG. 4 rises back to a potential equal to the sum of $V_{DD}$ plus the gate-to-source voltage of transistor 62, $V_{GS}62$. Thus, transistor 62 functions as a clamping transistor to limit the range of voltage on the gate of transistor 56. Since capacitor 58 is charged to approximately $V_{DD}$, the gate voltage of transistor 56 should be limited to approximately one gate-to-source voltage above $V_{DD}$. This is because the gate voltage of transistor 56 should be quickly lowered below $V_{DD}$ when the second plate of capacitor 58 is lowered and before the second plate of capacitor 54 is raised so that capacitor 54 is not discharged by transistor 56. Also, if for some reason the drive voltage on the gate of transistor 44 is inadequate, load transistor 50 will pull the output to $V_{DD}$ potential provided transistors 48 and 52 are not conducting.

A gate drive voltage approximating twice the supply voltage $V_{DD}$ has been provided to the enhancement load transistor 44. It will be appreciated that with the circuit of FIG. 3, load transistor 44 completely stops conducting when the output is intended to be at a low level. Thus no significant average current exists in the output at node 46. Further, the physical size of load transistor 44 is dependent upon the amount of gate voltage applied thereto by a square law proportionality. As a result of the large boosted driver voltage supplied, the output load transistor may be made small. Thus speed is improved and power is conserved.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. In an MOS driver circuit comprising:

active load means coupled between an output and a first supply voltage terminal, for coupling said output to said first supply voltage terminal in response to a driver voltage;

switching means coupled between said output and a second supply voltage terminal, for coupling said output to said second supply voltage terminal in response to an input signal;

a capacitive voltage booster circuit comprising:

a first capacitor coupled to said active load means, for developing said driver voltage on a first electrode thereof;

a second capacitor for developing a precharge voltage on a first electrode and having a second electrode coupled to said input signal;

a first precharge device controlled by said precharge voltage and coupled between said first supply voltage terminal and the first electrode of said first capacitor, for precharging the first electrode of said first capacitor to a first supply voltage in response to said input signal changing from a first predetermined level to a second predetermined level;

a second precharge device coupled between said first supply voltage terminal and the first electrode of said second capacitor, for precharging said second capacitor to substantially said first supply voltage;

a clamping device coupled between said first supply voltage terminal and said precharge voltage, for limiting the range of said precharge voltage which is coupled to said first precharge device;

control means coupled to said input signal, to the second electrode of said second capacitor and to said first and second supply voltage terminals, for switching the second electrode of said first capacitor between said first supply voltage and a second supply voltage in response to a change of level in said input signal, whereby said driver voltage is substantially boosted above said first supply voltage;

delay means coupled to said input signal, to said first and second supply voltage terminals, to said second electrode of said second capacitor, and to said control means, for allowing said precharge voltage to decrease and thereby substantially disable said first precharge device before said driver voltage is boosted; and disabling means coupled to said second supply voltage terminal, to said first capacitor, and to said first precharge device and said load means, for discharging the first electrode of said first capacitor to said second supply voltage in response to said input signal changing from said second level to said first level.

2. The MOS driver circuit of claim 1 wherein said first precharge device comprises a transistor having a first current electrode coupled to said first supply voltage terminal, a control electrode coupled to said second precharge device to said clamping device and to the first electrode of said second capacitor, and a second current electrode coupled to the first electrode of said first capacitor, to said disabling means and to said active load means.

3. The MOS driver circuit of claim 2 wherein said second precharge device comprises a transistor having both a first current electrode and a control electrode coupled to said first supply voltage terminal, and a second current electrode coupled to the first electrode of said second capacitor, to said first precharge device and to said clamping device.

4. The MOS driver circuit of claim 3 wherein said clamping device comprises a transistor having a first current electrode coupled to said first supply voltage terminal, and both a second current electrode and a control electrode coupled to the second current electrode of said second precharge device, to the first electrode of said second capacitor and to the control electrode of said first precharge device.

5. The MOS driver circuit of claim 4 wherein said disabling means comprise a transistor having a first current electrode coupled to the first electrode of said first capacitor, to the second current electrode of said first precharge device and to said active load means, a second current electrode coupled to said second supply voltage terminal, and a control electrode coupled to said input signal, to said control means and to said switching means.

6. The MOS driver circuit of claim 5 wherein said control means comprise a logic gate having a first input coupled to both said second capacitor and to said delay means, a second input coupled to said input signal, to said disabling means and to said switching means, and an output coupled to the second electrode of said first capacitor.

7. The MOS driver circuit of claim 6 wherein said logic gate is an active low AND gate.

8. The MOS driver circuit of claims 1 or 7 wherein said delay means comprise at least one inverter.

9. In an MOS driver circuit comprising:
active load means coupled between an output and a first supply voltage terminal, for coupling said output to a first supply voltage in response to a driver voltage;
switching means coupled between said output and a second supply voltage terminal, for coupling said output to a second supply voltage in response to an input signal;
a capacitive voltage booster circuit comprising:
a first capacitor coupled to said active load means, for developing said driver voltage on a first electrode thereof;

a second capacitor for developing a precharge voltage on a first electrode thereof and having a second electrode coupled to said input signal;
a first transistor controlled by said precharge voltage having a first current electrode coupled to said first supply voltage terminal, a control electrode coupled to the first electrode of said second capacitor, and a second current electrode coupled to both the first electrode of said first capacitor and said active load means, for precharging the first electrode of said first capacitor to a first supply voltage in response to said input signal changing from a first predetermined level to a second predetermined level;
a second transistor having both a first current electrode and a control electrode coupled to said first supply voltage terminal, and a second current electrode coupled to both the first electrode of said second capacitor and the control electrode of said first transistor, for precharging said second capacitor to substantially said first supply voltage;
a third transistor having a first current electrode coupled to said first supply voltage terminal, a control electrode and a second current electrode coupled to the second current electrode of said second transistor, to the first electrode of said second capacitor and to the control electrode of said first transistor, for limiting the range of said precharge voltage which is coupled to said first transistor;
a logic gate coupled to said input signal, to a second electrode of said second capacitor and to said first and second supply voltage terminals, for switching the second electrode of said first capacitor between said first supply voltage and a second supply voltage in response to a change of level in said input signal, whereby said driver voltage is substantially boosted above said first supply voltage;
delay means coupled to said input signal, said first and second supply voltage terminals, the second electrode of said second capacitor, and said logic gate, for allowing said precharge voltage to decrease and thereby substantially disable said first transistor before said driver voltage is boosted; and
a fourth transistor having a first current electrode coupled to the first electrode of said first capacitor, to the second current electrode of said first transistor and to said active load means, a second current electrode coupled to said second supply voltage, and a control electrode coupled to said input signal, to said logic gate and to said switching means, for discharging the first electrode of said first capacitor to said second supply voltage in response to said input signal changing from said second level to said first level.

10. In an MOS driver circuit comprising:
active load means coupled between an output and a first supply voltage terminal, for coupling said output to said first supply voltage terminal in response to a driver voltage;
switching means coupled between said output and a second supply voltage terminal, for coupling said output to said second supply voltage terminal in response to an input signal;
a capacitive voltage booster circuit comprising:
a first capacitor coupled to said active load means, for developing said driver voltage on a first electrode thereof;

a second capacitor for developing a precharge voltage on a first electrode and having a second electrode coupled to said input signal;

a first precharge device controlled by said precharge voltage and coupled between said first supply voltage terminal and the first electrode of said first capacitor, for precharging the first electrode of said first capacitor to a first supply voltage in response to said input signal changing from a first predetermined level to a second predetermined level;

a second precharge device coupled between said first supply voltage terminal and the first electrode of said second capacitor, for precharging said second capacitor to substantially said first supply voltage;

control means coupled to said input signal, to the second electrode of said second capacitor and to said first and second supply voltage terminals, for switching the second electrode of said first capacitor between said first supply voltage and a second supply voltage in response to a change of level in said input signal, whereby said driver voltage is substantially boosted above said first supply voltage;

delay means coupled to said input signal, to said first and second supply voltage terminals, to said second electrode of said second capacitor, and to said control means, for allowing said precharge voltage to decrease and thereby substantially disable said first precharge device before said driver voltage is boosted; and disabling means coupled to said second supply voltage terminal, to said first capacitor, and to said first precharge device and said load means, for discharging the first electrode of said first capacitor to said second supply voltage in response to said input signal changing from said second level to said first level.

* * * * *